(12) United States Patent
Li et al.

(10) Patent No.: US 6,221,733 B1
(45) Date of Patent: Apr. 24, 2001

(54) REDUCTION OF MECHANICAL STRESS IN SHALLOW TRENCH ISOLATION PROCESS

(75) Inventors: Xiao-Yu Li; Sunil D. Mehta, both of San Jose; Robert H. Tu, Sunnyvale, all of CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/192,096

(22) Filed: Nov. 13, 1998

(51) Int. Cl.$^7$ .................................................. H01L 21/76
(52) U.S. Cl. ........................ 438/424; 438/427; 438/435; 148/DIG. 50
(58) Field of Search .................................. 438/424, 427, 438/429, 435, 437, 296; 148/DIG. 50

(56) References Cited

U.S. PATENT DOCUMENTS

| | | | |
|---|---|---|---|
| 4,389,294 | * | 6/1983 | Anantha et al. . |
| 4,506,435 | * | 3/1985 | Pliskin et al. . |
| 5,200,348 | * | 4/1993 | Uchida et al. . |
| 5,985,735 | * | 11/1999 | Moon et al. ........................ 438/435 |

* cited by examiner

Primary Examiner—Trung Dang
(74) Attorney, Agent, or Firm—Davis Chin

(57) ABSTRACT

A method of minimizing mechanical stress generated during the trench-forming/trench-filling process steps in a standard shallow trench isolation (STI) process is provided. This is achieved by forming trenches with a more sloped and smoother profile, and/or limiting the trench depth to be less than 0.4 µm, and/or reducing or increasing the trench densification temperature, and/or performing the densification step after the chemical-mechanical polishing step. In addition, a furnace TEOS oxide film is used as the trench-filling material.

20 Claims, 3 Drawing Sheets

000# REDUCTION OF MECHANICAL STRESS IN SHALLOW TRENCH ISOLATION PROCESS

BACKGROUND OF THE INVENTION

1. Field of the Invention

This invention relates generally to methods for fabricating semiconductor integrated circuits such as memory devices and more particularly, it relates to a method of minimizing or eliminating mechanical stress generated during the trench-forming/trench-filling process steps in a standard shallow trench isolation process.

2. Description of the Prior Art

As is generally known, in the manufacturing of semiconductor integrated circuits there is typically required isolation of devices (active regions) from one another which are formed on a semiconductor substrate. One such isolation technique is known as LOCOS (local oxidation of silicon) where an isolation region is grown on the substrate between the active regions by thermal oxidation. However, in view of the advances made in semiconductor integrated circuit technology and reduction of device sizes so as to achieve higher density, it has been found that a newer isolation method referred to as "shallow trench isolation" (STI) has become the replacement for the conventional LOCOS technology for sub-micron process technology. In the basic STI technology, there is involved the etching of the semiconductor substrate in order to form trenches and thereafter the re-filling of the trenches with an insulating material so as to produce an isolation region.

While it is desirable to use silicon dioxide layers as trench fill dielectric layers within advanced integrated circuit fabrication, it is generally known that such trench-refilling oxide may shrink during subsequent fabrication steps (e.g., thermal annealing) which will cause mechanical stress in the active silicon substrate. This mechanical stress is believed to cause the generation of dislocations or defect sites in the active substrate. This problem is discussed in a paper entitled "Mechanical Stress Induced MOSFET Punch-Through and Process Optimization for Deep Submicron TEOS-$O_3$ Filled STI Device," by K. Ishimaru et al., 1997 Symposium on VLSI Technology Digest of Technical Papers, pp. 123–124.

Further, in one case investigated it was found that there existed a high leakage current path along the source and drain regions of a transistor device formed during subsequent steps in the substrate, thereby rendering a lower produce yield. While there have been many attempts made in the prior art of creating various process fixes so as to solve this mechanical stress problem, most of the proposed process changes have suffered from the disadvantages of causing some other types of detrimental effects or have been generally not suitable for application involving non-volatile memory technology.

Accordingly, it would be desirable to provide a method of minimizing or eliminating mechanical stress in current standard STI process on a more effective and efficient basis. This is achieved in the present invention by either, (a) forming a trench with a more sloped and smooth profile, (b) limiting the trench depth to be less than 0.4 $\mu$m, (c) reducing or increasing the trench densification temperature, and/or (d) performing the densification step after chemical-mechanical polishing.

SUMMARY OF THE INVENTION

Accordingly, it is a general object of the present invention to provide a method of minimizing or eliminating mechanical stress in a standard STI process which overcomes the problems of the prior art.

It is an object of the present invention to provide a method of minimizing or eliminating mechanical stress in a standard STI process which can be implemented with only minor modifications to the same.

It is another object of the present invention to provide a method of minimizing mechanical stress in a standard STI process which includes forming trenches with a more sloped and smooth profile.

It is still another object of the present invention to provide a method of minimizing mechanical stress in a standard STI process which includes either reducing or increasing the trench densification temperature.

It is yet another object of the present invention to provide a method of minimizing mechanical stress in a standard STI process which includes the step of performing a densification after the chemical-mechanical polishing step.

In accordance with a preferred embodiment of the present invention, there is provided a method of minimizing or eliminating mechanical stress in a standard shallow trench isolation (STI) process. An epitaxial layer is formed on a top surface of a semiconductor substrate. A barrier oxide layer is formed on a top surface of the epitaxial layer. A nitride layer is deposited on a top surface of the barrier oxide layer. A plurality of trenches are formed through the nitride layer and the barrier oxide layer and into the epitaxial layer to a depth of less than 4,000 Å so as to create isolation regions to electrically isolate active regions in the epitaxial layer from each other. A liner oxide layer is formed on the sidewalls and bottom of the trenches.

The trenches are filled completely with a trenchfilling material which has less volume shrinkage coefficient than an ozone-TEOS film to form an oxide layer. The oxide layer is polished away down to the top surface of the nitride layer. Thermal annealing is performed on the substrate subsequent to the polishing of the oxide layer.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1A:
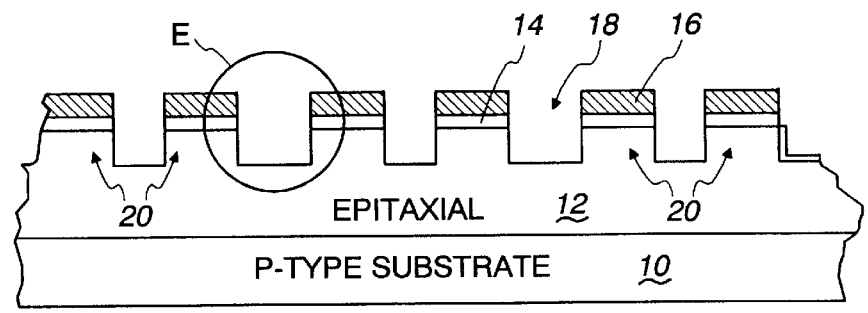
FIGS. 1(a)–1(c) are cross-sectional views of fabrication steps for forming the trenches and re-filling the same, according to a conventional STI fabrication technique.
Figure 1B:
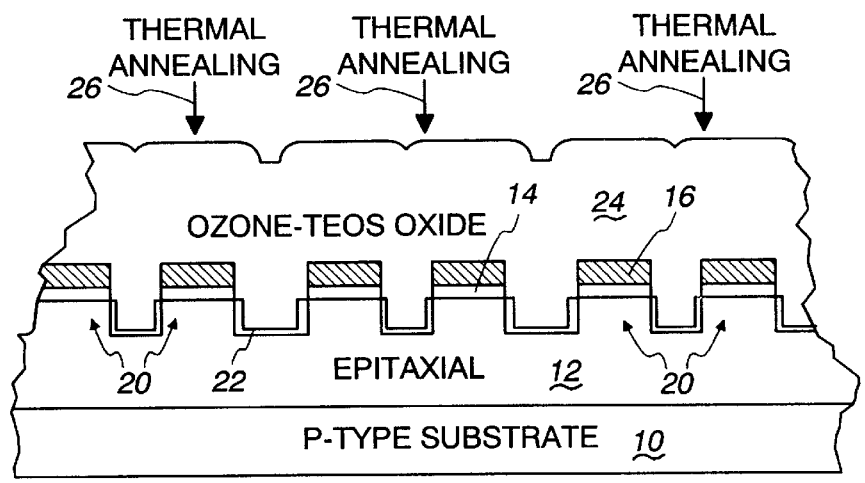
Figure 1C:
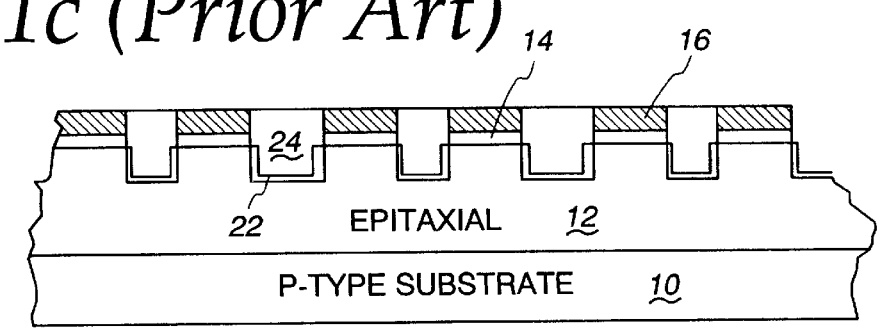

Before describing in detail the method of minimizing or eliminating mechanical stress of the present invention, it is believed that it would be helpful in understanding the principles of the instant invention and to serve as a background by explaining initially the fabrication steps for forming the trenches in the semiconductor substrate to isolate active areas of an integrated circuit device from one another and re-filling the same in accordance with a conventional standard shallow trench isolation (STI) fabrication technique with reference to FIGS. 1(a)–1(c). Thus, the conventional STI fabrication process employed for forming trenches and re-filling the same will now be described hereinbelow as well as the problems associated therewith.

In FIG. 1 (a), there is shown a p-type semiconductor substrate 10, preferably of monocrystalline silicon, on top of which is formed an n-type epitaxial (EPI) layer 12. The epitaxial layer 12 is typically less than 10 $\mu$m thick and is approximately 7 $\mu$m. A thin barrier or pad oxide layer 14 is formed on the top surface of the EPI layer 12 to a thickness on the order of 110 Å. Then, a nitride layer 16 is deposited by low pressure chemical vapor deposition (LPCVD) on top of the pad oxide layer 14 to a thickness on the order of 1500 Å.

Figure 2:
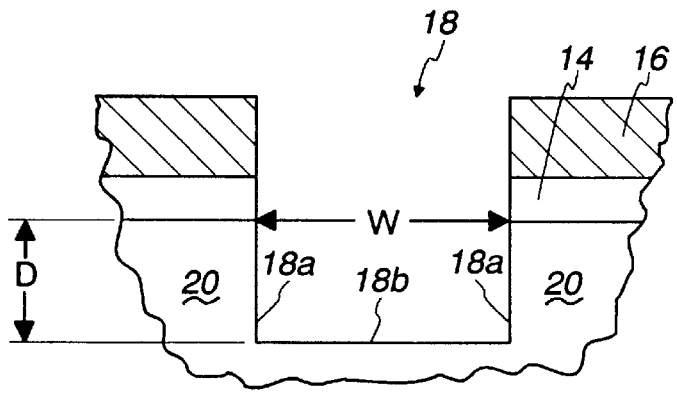
FIG. 2 is an enlarged view of the encircled portion E, illustrating one of the trench profiles.

A plurality of shallow trenches 18 are etched through the nitride layer 16 and the pad oxide layer 14 and into the EPI layer 12 using conventional photo-lithography and anisotropic etching techniques so as to electrically isolate active regions 20 in the EPI layer 12. Each of the isolation trenches 18 has a width W of about 0.4 $\mu$m and a depth D of about 0.4 to 0.5 $\mu$m. As can best be seen from FIG. 2, the trenches 18 have a very steep profile in which the sidewalls 18a are vertical and formed at right angles or perpendicularly to the bottom wall 18b. Next, after the trenches 18 have been formed, a liner oxide layer 22 is grown to a thickness of about 500 Å on the sidewalls 18a and the bottom wall 18b of the trenches, which serves to produce better isolation. This is illustrated in FIG. 1(b).

The inventors have found through investigation that the amount of mechanical stress created during the trench formation is dependent upon the depth of the trenches and the profile of the trenches. Thus, the inventors have proposed to limit the depth of the trenches to be less than 0.4 $\mu$m in order to reduce the mechanical stress. Also, the inventors propose to modify the steep trench profile so as to provide a more sloped and smooth profile, thereby further reducing mechanical stress.

Referring now still to FIG. 1(b), an ozone-TEOS (tetraethoxysilane) oxide layer 24 is deposited over the topography of FIG. 1(a) to fill completely the trenches 18 and up to a thickness of approximately 8,000 Å. Since the problem of mechanical stress is caused by volume shrinkage of the trench-filling film used, the use of a trench-filling film having less shrinkage will create less stress. Therefore, the inventors have proposed to replace the $O_3$-TEOS oxide film having a temperature coefficient of greater than 5% with a furnace TEOS oxide film as the trench-filling material. Due to the fact that the furnace TEOS oxide material has a smaller temperature coefficient of about 3% or 4%, then there will be produced less mechanical stress.

After the deposition of the $O_3$-TEOS oxide layer 24, a thermal annealing step is performed on the oxide film in the trenches 18, as indicated by the arrows 26, so as to effect densification of the oxide. It is generally known that densification of the deposited oxide is required in order to enhance the resistance of the oxide to etching during subsequent processing. This annealing step is conducted in a nitrogen atmosphere at the temperature of about 1000° C. for 30 minutes in order to prevent oxidation of the silicon substrate beneath the trench oxide.

Figure 3:
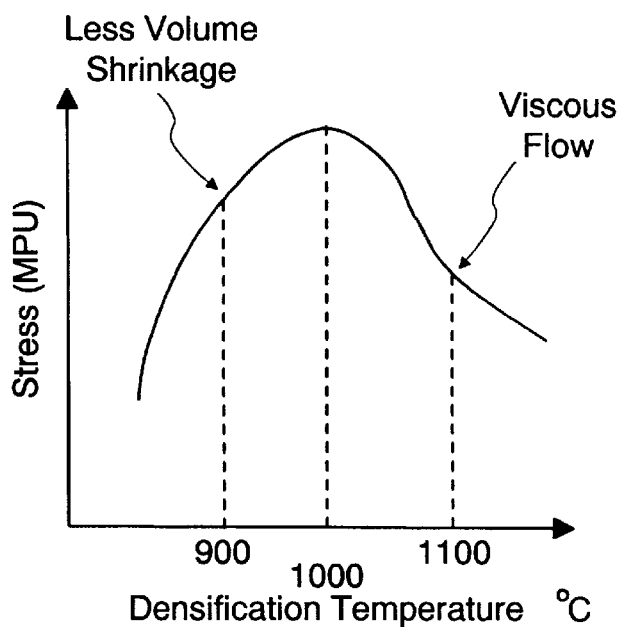
FIG. 3 is a graph showing a plot of the mechanical stress of $O_3$-TEOS film as a function of densification temperature.
Figure 5:
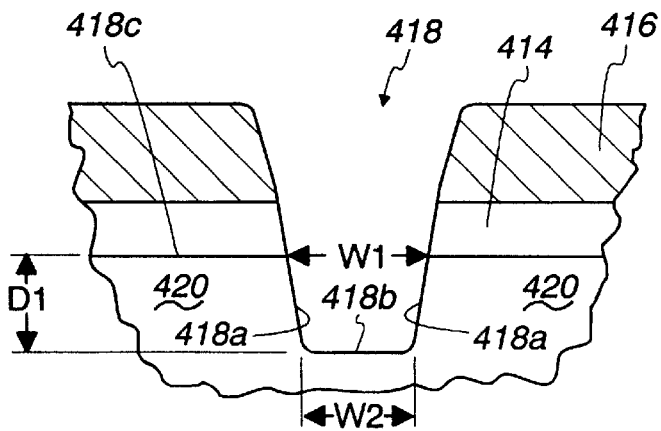
FIG. 5 is an enlarged view of the encircled portion F, illustrating one of the sloped trench profiles.

With reference to FIG. 3, there is shown a graph of the mechanical stress of the $O_3$-TEOS fill material as a function of the densification temperature. In order to reduce the volume shrinkage of the trench-filling material and thus create less stress, the inventors have proposed to lower the densification temperature to below 900° C. Alternatively, the inventors found through investigation that the densification temperature can be raised above 1100° C. for reducing stress. While there will be a larger amount of shrinkage in the trench-filling film at the higher densification temperature, it was determined that at such higher temperatures a viscous flow existed and hence created less stress.

After densification, the $O_3$-TEOS oxide layer 24 is planarized by means of resist etch-back techniques with a filler mask followed by resist strips and polishing down to the top surface of the nitride layer 16. This is performed by means of a chemical-mechanical polishing (CMP) step as is well known to those skilled in the art. This resulting structure is illustrated in FIG. 1(c).

Since the CMP step is performed after the densification, it is believed by the inventors that the thicker $O_3$-TEOS oxide layer 24 existing above the silicon substrate, as shown in FIG. 2(b), during the annealing step will cause more mechanical stress to be produced.

Therefore, in order to further reduce or eliminate stress, the inventors propose to reverse the flow process of densification and CMP. In other words, the densification step in FIG. 2(b) will be performed after the CMP step as illustrated in FIG. 2(c). As a consequence, there will be less oxide film remaining above the 30 silicon substrate during the densification since substantially all of the trench-filling material will have been removed and only the nitride layer 16 is left. Thus, there will be less mechanical stress created.

The method of minimizing or eliminating mechanical 35 stress, generated during the trench-forming/trench-filling steps in a conventional shallow trench isolation (STI) process, in accordance with the principles of the present invention will now be described with reference to FIGS. 4(a)–4(c) and 5. The present method of reducing or eliminating mechanical stress is accomplished by either, (a) forming a trench with a more sloped and smoother profile, and/or (b) limiting the trench depth to be less than 0.4 $\mu$m, and/or (c) reducing or increasing the trench densification temperature, and/or (d) performing the densification step after the chemical-mechanical polishing step, or any combination of the steps (a), (b), (c) and (d). While only one of the above steps is needed to be performed, it is believed that performing all of the steps (a), (b), (c) and (d) the optimal solution of eliminating mechanical stress can be obtained.

Figure 4A:
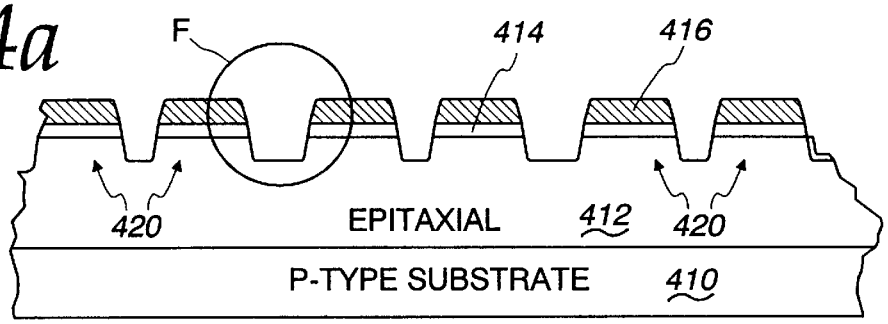
FIGS. 4(a)–4(c) are cross-sectional views of fabrication steps for forming the trenches and re-filling the same, in accordance with the principles of the present invention.
Figure 4B:
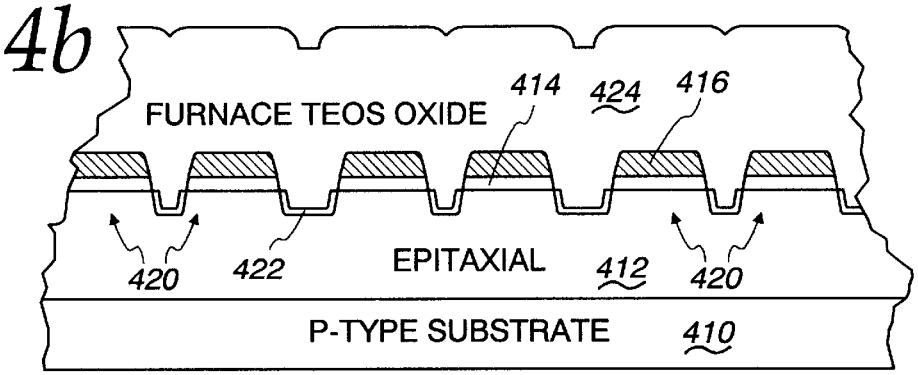
Figure 4C:
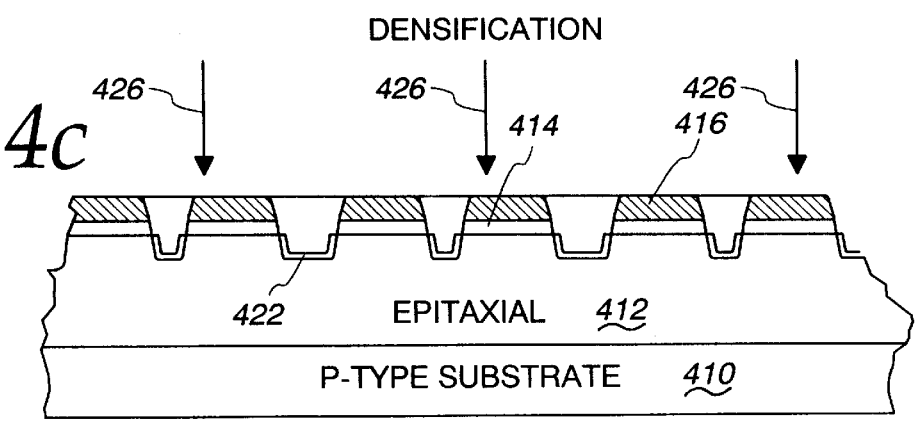

Referring now in particular to FIGS. 4(a)–4(c), there is illustrated the fabrication steps for forming trenches and re-filling the same of the present method so as to reduce or eliminate mechanical stress. In FIG. 4(a), there is shown a p-type semiconductor substrate 410, preferably of monocrystalline silicon, on top of which is formed an n-type epitaxial (EPI) layer 412. The EPI layer 412 is typically less than 10 $\mu$m thick and is preferably 7 $\mu$m. A thin barrier or pad oxide layer 414 is formed on the top surface of the EPI layer 412 to a thickness on the order of 110 Å. Then, a nitride layer 416 is deposited by low pressure chemical vapor deposition (LPCVD) on top of the pad oxide layer 414 to a thickness on the order of 1500 Å.

A plurality of shallow trenches 418 are etched through the nitride layer 416 and the pad oxide layer 414 and into the EPI layer 412 utilizing conventional photolithography and anisotropic etching techniques so as to electrically isolate active regions 420 in the EPI layer 412. Each of the trenches 418 has a depth D1 of less than 0.4 $\mu$m, a width W1 of about 0.4 μm across the top surface thereof adjacent to the nitride layer 416, and a narrow width W2 of about 0.3 μm across the bottom surface thereof disposed in the EPI layer 412. As can best be seen from FIG. 5, the trenches 418 have opposed sloped vertical sidewalls 418a which extend inwardly between the top surface 418c and the bottom surface 418b.

Based upon experimental data obtained by the inventors, it was determined that the more sloped and smoother trench profile obtained by controlling the recipe of the trench etching produced significantly less product defects (on the order of several times less). Further, the depth of the trenches 418 were maintained to be less than 0.4 μm and more preferably to be about 0.3750 μm from the top surface 418c of the EPI layer 412 so as to reduce mechanical stress.

Next, after the shallow trenches 418 having a sloped and smooth profile have been formed, a liner oxide layer 422 is grown to a thickness of about 500 Å on the vertical sidewalls 418a and the bottom surface 418b of the trenches so as to enhance isolation. This is illustrated in FIG. 4(b). Then, a furnace TEOS oxide layer 424 is deposited over the topography of FIG. 4(a) to completely fill the trenches 418 up to a thickness of approximately 8000 Å. Unlike the standard STI process, the furnace TEOS film 424 is used as the trench-filling material which has less porosity than the $O_3$-TEOS film. As a result, the inventors found that the furnace TEOS film having a smaller temperature shrinkage coefficient (3% or 4%) created less mechanical stress.

Next, a chemical-mechanical polishing (CMP) step is performed for removing and planarizing of a substantial portion of the furnace TEOS oxide layer 424 to the top surface of the nitride layer 416. This resulting structure is shown in FIG. 4(c). Finally, after the CMP step a thermal annealing step is performed on the structure of FIG. 4(c), as indicated by the arrows 426, so as to effect densification of the oxide. It will be noted that unlike the standard STI process flow where densification is performed immediately before the CMP step, the present method utilizes the trench densification step after the CMP step. As observed by the inventors, there was realized a significant reduction (several times lower) in the product defect, which is believed due to less mechanical stress being created by removal of a large portion of the furnace TEOS oxide film 424.

Based upon the observations made with respect to the curve of FIG. 3 as previously pointed out above, the densification temperature in the present invention was decreased or reduced to below 900° C. such as 875° C. so as to produce less volume shrinkage of the furnace TEOS oxide film and therefore to reduce mechanical stress. Alternatively, the densification temperature of the present method was increased to above 1100° C. so as to provide viscous flow in the furnace TEOS oxide film and therefore again reducing the mechanical stress. Since all of the modifications made to the conventional STI process are minimal, they therefore do not increase significantly the manufacturing costs.

From the foregoing detailed description, it can thus be seen that the present invention provides a method for eliminating or reducing mechanical stress generated during the trench-forming/trench-filling process steps in a standard STI process. This is achieved by either forming a trench with a more sloped and smoother profile, reducing or increasing the densification temperature, or performing the densification step after the chemicalmechanical polishing step.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method for minimizing mechanical stress in a standard shallow trench isolation process, comprising the steps of:

providing a semiconductor substrate;

forming an epitaxial layer on a top surface of said semiconductor substrate;

forming a pad oxide layer on a top surface of said epitaxial layer;

depositing a nitride layer on a top surface of said pad oxide layer;

etching a plurality of trenches through said nitride layer and said oxide layer and into said epitaxial layer so as to create isolation regions in order to electrically isolate active regions in said epitaxial layer;

forming a liner oxide layer on sidewalls and bottom of said trenches to enhance isolation;

filling completely said trenches with a trench-filling material having a less volume shrinkage coefficient than an ozone-TEOS film to form an oxide layer;

polishing away said trench-filling oxide layer down to the top surface of said nitride layer; and performing a thermal annealing on said substrate subsequent to the step of polishing away said trench-filling oxide layer.

2. A method for minimizing mechanical stress as claimed in claim 1, wherein said trench-filling oxide layer is a furnace TEOS film.

3. A method for minimizing mechanical stress as claimed in claim 2, wherein said thermal annealing step is performed for densification of said furnace TEOS film at a temperature below 900° C. for about 30 minutes.

4. A method for minimizing mechanical stress as claimed in claim 3, wherein said step of forming trenches includes forming said trenches with a sloped profile.

5. A method for minimizing mechanical stress as claimed in claim 4, wherein said trenches have opposed sidewalls which extend inwardly from a top surface to a bottom surface.

6. A method for minimizing mechanical stress as claimed in claim 5, wherein said trenches have a first width dimension of about 0.4 μm adjacent the top surface and a second width dimension of about 0.3 μm adjacent the bottom surface.

7. A method for minimizing mechanical stress as claimed in claim 6, wherein said trenches have a depth dimension of less than 0.4 μm extending between the top surface and the bottom surface.

8. A method for minimizing mechanical stress as claimed in claim 2, wherein said thermal annealing step is performed for densification of said furnace TEOS film at a temperature above 1100° C. for about 30 minutes.

9. A method for minimizing mechanical stress as claimed in claim 8, wherein said step of forming trenches includes forming said trenches with a sloped profile.

10. A method for minimizing mechanical stress as claimed in claim 9, wherein said trenches have opposed sidewalls which extend inwardly from a top surface to a bottom surface.

11. A method for minimizing mechanical stress as claimed in claim 10, wherein said trenches have a first width dimension of about 0.4 µm adjacent the top surface and a second width dimension of about 0.3 µm adjacent the bottom surface.

12. A method for minimizing mechanical stress as claimed in claim 11, wherein said trenches have a depth dimension of less than 0.4 µm extending between the top surface and the bottom surface.

13. A method for minimizing mechanical stress in a standard shallow trench isolation process, comprising the steps of:

provid a semiconductor substrate;

forming an epitaxial layer on a top surface of said semiconductor substrate;

forming a pad oxide layer on a top surface of said epitaxial layer;

depositing a nitride layer on a top surface of said pad oxide layer;

etching a plurality of trenches with a sloped profile through said nitride layer and said oxide layer and into said epitaxial layer so as to create isolation regions in order to electrically isolate active regions in said epitaxial layer;

forming a liner oxide layer on sidewalls and bottom of said trenches to enhance isolation;

filling completely said trenches with a trenchfilling material having a less volume shrinkage coefficient than an ozone-TEOS film to form an oxide layer;

polishing away said trench-filling oxide layer down to the top surface of said nitride layer; and performing a thermal annealing on said substrate subsequent to the step of polishing away said trench-filling oxide layer.

14. A method for minimizing mechanical stress as claimed in claim 13, wherein said trenches have opposed sidewalls which extend inwardly from a top surface to a bottom surface.

15. A method for minimizing mechanical stress as claimed in claim 14, wherein said trenches have a first width dimension of about 0.4 µm adjacent the top surface and a second width dimension of about 0.3 µm adjacent the bottom surface.

16. A method for minimizing mechanical stress as claimed in claim 15, wherein said trenches have a depth dimension of less than 0.4 µm extending between the top surface and the bottom surface.

17. A method for minimizing mechanical stress in a standard shallow trench isolation process, comprising the steps of:

providing a semiconductor substrate;

forming an epitaxial layer on a top surface of said semiconductor substrate;

forming a pad oxide layer on a top surface of said epitaxial layer;

depositing a nitride layer on a top surface of said pad oxide layer;

etching a plurality of trenches with a sloped profile through said nitride layer and said oxide layer and into said epitaxial layer so as to create isolation regions in order to electrically isolate active regions in said epitaxial layer;

forming a liner oxide layer on sidewalls and bottom of said trenches to enhance isolation;

filling completely said trenches with a trench-filling material having a less volume shrinkage coefficient than an ozone-TEOS film to form an oxide layer;

performing a thermal annealing on said substrate subsequent to the step of filling completely said trenches; and polishing away said trench-filling oxide layer down to the top surface of said nitride layer.

18. A method for minimizing mechanical stress as claimed in claim 17, wherein said trenches have opposed sidewalls which extend inwardly from a top surface to a bottom surface.

19. A method for minimizing mechanical stress as claimed in claim 18, wherein said trenches have a first width dimension of about 0.4 µm adjacent the top surface and a second width dimension of about 0.3 µm adjacent the bottom surface.

20. A method for minimizing mechanical stress as claimed in claim 19, wherein said trenches have a depth dimension of less than 0.4 µm extending between the top surface and the bottom surface.

* * * * *

UNITED STATES PATENT AND TRADEMARK OFFICE
CERTIFICATE OF CORRECTION

PATENT NO.   : 6,221,733 B1
DATED        : April 24, 2001
INVENTOR(S)  : X. Li et al.

It is certified that error appears in the above-identified patent and that said Letters Patent is hereby corrected as shown below:

Column 2,
Line 33, change "trenchfilling" to -- trench-filling --.

Column 4,
Line 28, cancel "30".
Line 32, cancel "35".

Column 5,
Line 62, change "chemicalmechanical" to -- chemical-mechanical --.

Column 7,
Line 30, change "trenchfilling" to -- trench-filling --.

Signed and Sealed this

Sixth Day of November, 2001

Attest:

NICHOLAS P. GODICI
Attesting Officer  Acting Director of the United States Patent and Trademark Office